(12) United States Patent
Mani

(10) Patent No.: US 8,835,101 B1
(45) Date of Patent: Sep. 16, 2014

(54) METHOD FOR FABRICATING A CIRCUIT

(75) Inventor: Krishnakumar Mani, Santa Clara, CA (US)

(73) Assignee: III Holdings 1, LLC, Wilmington, DE (US)

( * ) Notice: Subject to any disclaimer, the term of this patent is extended or adjusted under 35 U.S.C. 154(b) by 0 days.

(21) Appl. No.: 13/155,299

(22) Filed: Jun. 7, 2011

(51) Int. Cl.
*G03F 7/26* (2006.01)

(52) U.S. Cl.
USPC ........................................... 430/314

(58) Field of Classification Search
USPC ................................. 430/311, 312, 313, 394
See application file for complete search history.

(56) References Cited

U.S. PATENT DOCUMENTS

| | | | |
|---|---|---|---|
| 2003/0129543 A1* | 7/2003 | Hwang et al. | 430/311 |
| 2007/0018286 A1* | 1/2007 | Chen | 257/640 |
| 2009/0004604 A1* | 1/2009 | Lee et al. | 430/314 |

* cited by examiner

*Primary Examiner* — Caleen Sullivan

(74) *Attorney, Agent, or Firm* — McAndrews, Held & Malloy, Ltd.

(57) ABSTRACT

A method for fabricating a circuit, by defining a first set of resist features on a substrate and corresponding to a first mask layout, followed by defining a second set of resist features on the substrate corresponding to a second mask layout, wherein the second set adds to the first set for rectifying an error in either mask layout. In another aspect, the method is by defining a first set of resist features on a substrate and corresponding to a first mask layout that has an error, etching the substrate while the first set protects selected regions, defining a second set of resist features on the substrate and corresponding to a second mask layout, followed by etching the substrate to selectively remove portions of the selected regions for rectifying the error.

5 Claims, 5 Drawing Sheets

METHOD FOR FABRICATING A CIRCUIT

FIELD

Embodiments of the invention relate to a method for fabricating a circuit.

BACKGROUND

Micro-patterning using lithographic technology is well known, particularly in the semiconductor fabrication industry. Lithographic technology generally involves the steps of: a) providing a radiation-sensitive resist layer on a substrate, b) exposure of the resist layer to a radiation through a mask, where the mask has a predetermined pattern of transparent and opaque regions, and c) development of the resist layer in a developer solution, thereby forming a pattern of resist features in the resist layer, corresponding to the predetermined pattern on the mask.

The substrate is then processed further, generally with a step of implantation or etch, while the pattern of resist features protect selected region(s) on the substrate from being implanted or etched respectively. In a positive-tone resist, the portions that are exposed to the radiation through the transparent regions in the mask become soluble in the developer solution, and in a negative-tone resist the portions that are exposed to the radiation through the transparent regions in the mask become insoluble in the developer solution. The radiation used is generally ultra-violet light (UV) or extreme UV light (EUV). The positive-tone and the negative tone resists are generally sensitive to different wavelength regions of the radiation. X-rays, ion beams or electron beams are also used for exposure, generally for direct-write in mask-less lithographic systems and with corresponding resists.

SUMMARY OF THE INVENTION

According to a first aspect of the invention, a method for fabricating a circuit is proposed. A first set of resist feature(s) is defined on a partially processed substrate and with a first tone resist, the first set corresponding to a first mask layout. A layer of a second tone resist is provided on the substrate and partially encapsulating the first set. A second set of resist feature(s) is defined on the substrate and with the second tone resist. The second set corresponds to a second mask layout and adds to the first set for rectifying an error in either mask layout. The substrate is then processed while the first and second sets protect selected region(s) on the substrate.

According to an embodiment, said error causes two lines of said circuit on said substrate to be disconnected instead of being connected.

According to another embodiment, the method uses one of the following combinations wherein:
a) the first tone resist is a positive tone resist and the second tone resist is a negative tone resist,
b) the first tone resist is a negative tone resist and the second tone resist is a positive tone resist,
c) both of said first and second tone resists are negative tone resists, and
d) at least either of said first and second tone resists for any one of the preceding combinations at a) to c) is a photoresist.

According to another embodiment, the processing with the first and second sets is for at least one of the following steps:
a) implantation and
b) etch.

According to another aspect, a second method for fabricating a circuit is proposed. A first set of resist feature(s) is defined on a partially processed substrate and corresponding to a first mask layout, wherein the first mask layout has an error. The substrate is then etched while the first set protects first selected region(s) on the substrate. The first set is then stripped. A second set of resist feature(s) is defined on the substrate and corresponding to a second mask layout. The substrate is then etched while the second set protects second selected regions on the substrate, the etching being to selectively remove portion(s) of the first selected region(s) on the substrate and to form void(s) therein for rectifying the error.

According to an embodiment of the second aspect, the error causes two lines of the circuit on the substrate to be connected instead of being disconnected.

According to an embodiment of the second aspect, the first selected region(s) is/are in a metallization layer.

According to an embodiment of the second aspect, the method further comprises processing for at least partially filling the void(s) with a dielectric material.

According to an embodiment of the second aspect, both of the first and second sets are defined by positive-tone photoresists.

According to the embodiments of the two aspects, the substrate originates from one of the following:
a) a semiconductor wafer,
b) a lithium niobate wafer, and
c) a silicon on insulator (SOI) wafer.

The embodiments of the first aspect of the invention help in rectifying an error in a main mask by using another mask that rectifies the error, to generate an error free pattern of resist feature on the substrate. The substrate is then processed further, such as with steps of implantation or etch. According to the embodiments of the second aspect of the invention, a substrate that is already processed with the main mask bearing the error can also be rectified by further processing the substrate with the mask for rectifying the error. This mask for rectifying the error can generally be fabricated at a much cheaper cost than the main mask, due to significantly reduced complexity.

BRIEF DESCRIPTION OF THE DRAWINGS

FIG. 2B-2 shows a flowchart of processes of lithography and etch for rectifying an error in a mask layout, in accordance with an embodiment that is an alternative to the process shown at FIG. 2B-1.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the invention disclose a method to use a rectifying mask for rectifying a resist pattern that is generated on a substrate by an erroneous main mask. Advantageously, embodiments of the invention save rejection of the erroneous main mask and remaking of a corrected main mask. Generally, due to significantly reduced complexity, the rectifying mask can be made at a much cheaper cost than the main mask. Embodiments of the invention also disclose a method to rectify a substrate that is already processed with an erroneous main mask. In this method, the substrate is further processed with a rectifying mask and advantageously, saves rejection of both, the erroneous main mask as well as the semi-processed substrate.

Figure 1A:
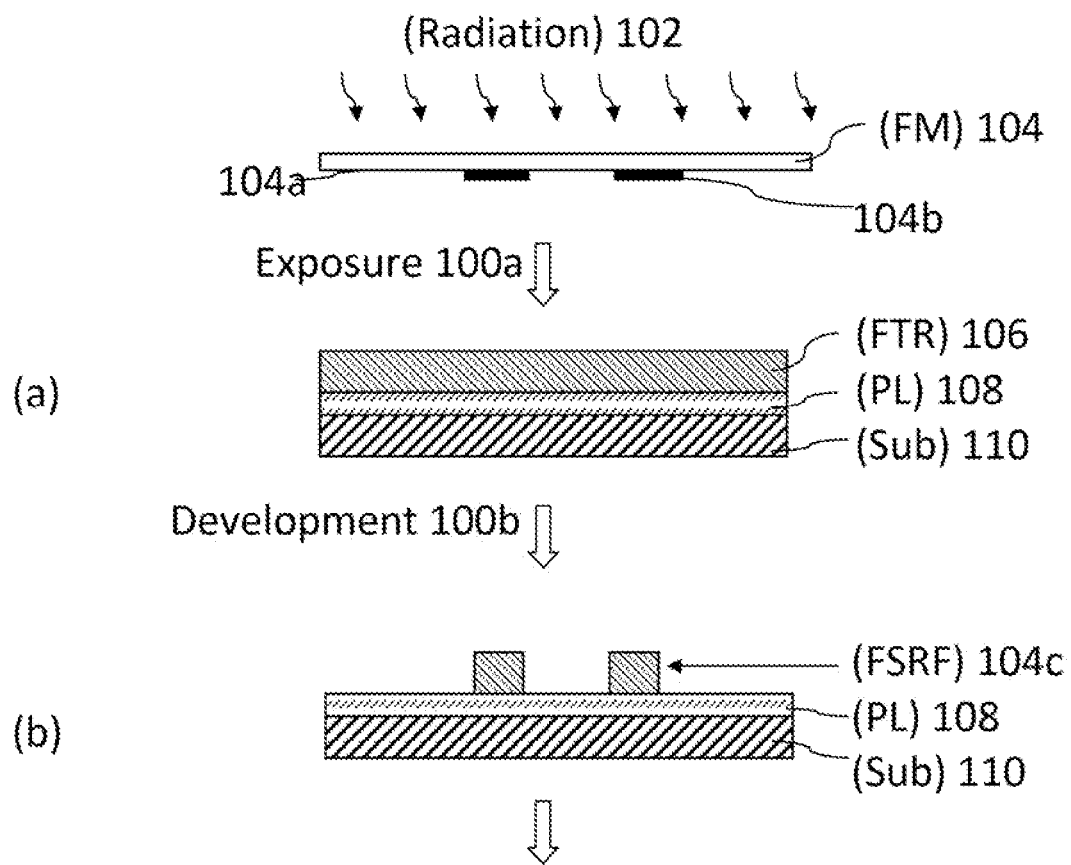
FIGS. 1A and 1B show a flowchart of a process of lithography for rectifying an error in a mask layout, in accordance with an embodiment of a first aspect of the invention.
Figure 1B:
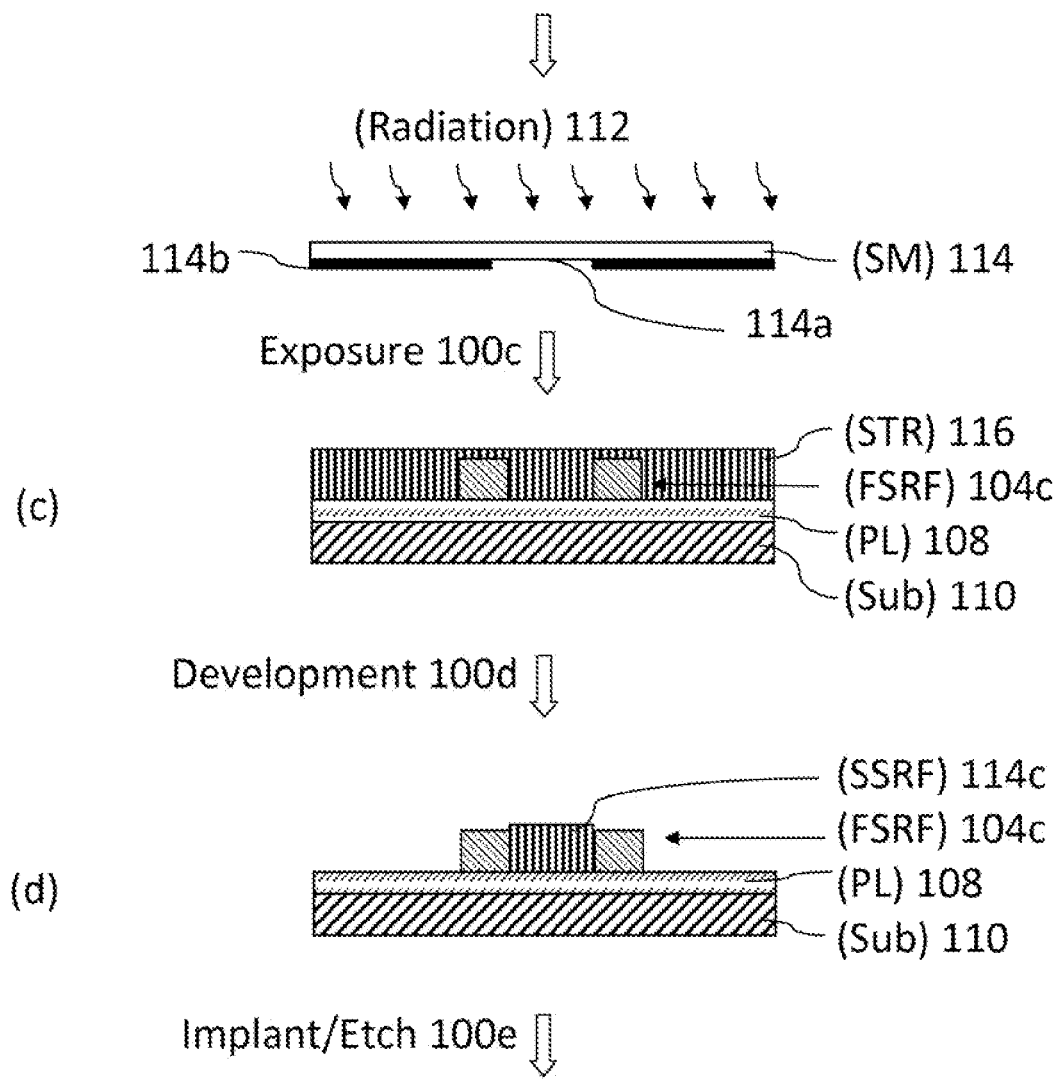

FIGS. 1A and 1B show a flowchart of a process of lithography for rectifying an error in a mask layout, in accordance with one embodiment of a first aspect of the invention. As shown in FIG. 1A, a first mask (FM) 104 is used according to a first mask layout, which includes transparent regions 104a and opaque 104b regions. As shown at (a), a first tone resist (FTR) 106 is provided on a processed layer (PL) 108 on a substrate (Sub) 110. The FTR 106 is given an exposure 100a to radiation 102 through the transparent regions 104a of the FM 104. In this embodiment, FTR 106 is a positive-tone resist, hence the exposed regions will be removed during the step of development 100b, to form a first set of resist feature (FSRF) 104c, as shown at (b). A second mask (SM) 114 is then used according to a second mask layout, bearing transparent 114a and opaque 114b regions. As shown at (c), a layer of a second tone resist (STR) 116 is provided on the PL 108 and partially encapsulating the FSRF 104c. The STR 116 is provided with an exposure 100c to radiation 112. After development 100d, a second set of resist feature (SSRF) 114c is defined on the PL 108, in addition to FSRF 104c as shown at (d), for rectifying an error in either mask layout. Sub 110 then proceeds for further processing such as an implant or etch step 100e, while FSRF 104c and SSRF 114c protect selected region(s) on PL 108. In this embodiment, the error causes the two FSRF 104c on the PL 108 to be disconnected instead of being connected. The SSRF 114c is used to connect the two FSRF 104c. In other embodiments (not shown), the SSRF 114c may be used to extend the FSRF 104c or may also be used in isolation from the FSRF 104c. In this embodiment, the FTR 106 is a positive tone photoresist and the STR 116 is a negative tone photoresist. However, in another embodiment (not shown), the FTR 106 may be a negative tone photoresist and the STR 116 may be a positive tone photoresist, with appropriate corresponding mask layouts. In yet another embodiment (not shown), both of the FTR 106 and the STR 116 may be negative tone photoresists. For defining the SSRF 114c after the FSRF 104c, some extra processing steps may be required, such as an ultraviolet baking step for the FSRF 104c before providing the STR 116. However, such requirements for extra steps would depend on the combination of the two resists and their tones used. The choice of the FTR 106 and the STR 116 would be limited by the geometries of the FSRF 104c and the SSRF 114c.

Figure 2A:
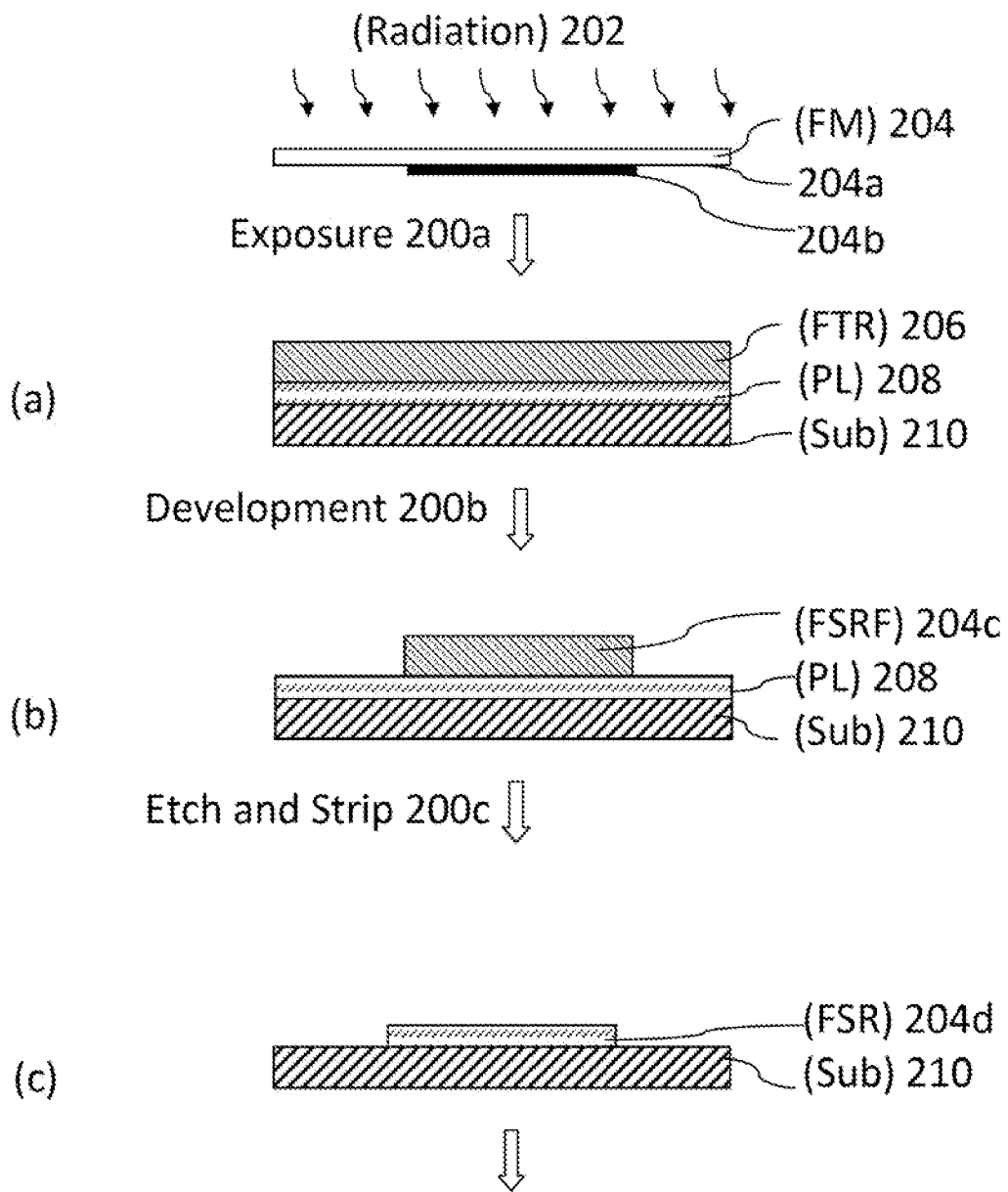
FIGS. 2A and 2B-1 show a flowchart of processes of lithography and etch for rectifying an error in a mask layout, in accordance with an embodiment of a second aspect of the invention.
Figures 1, 2B:
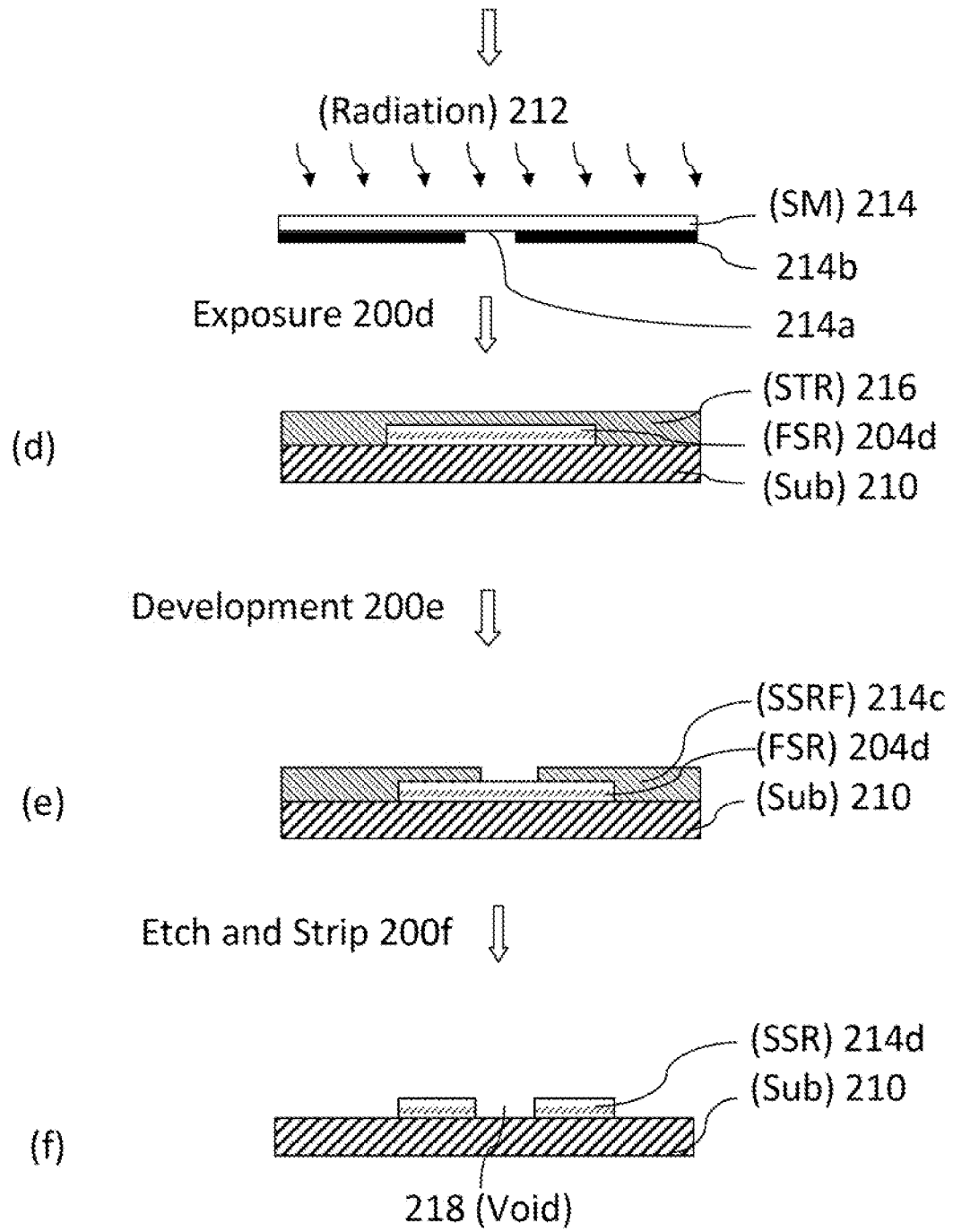

FIGS. 2A and 2B-1 show a flowchart of processes of lithography and etch for rectifying an error in a mask layout, in accordance with one embodiment of a second aspect of the invention. A first mask (FM) 204 is used according to a first mask layout, the FM 204 bearing transparent 204a and opaque 204b regions. The first mask layout has an error, in that for example, the opaque region 204b should have been split into two opaque regions 204b. As shown at (a), a first tone resist (FTR) 206 is provided on a processed layer (PL) 208 on a substrate (Sub) 210. The FTR 206 is given an exposure 200a to a radiation 202, through the transparent regions 204a of FM 204. In this embodiment, FTR 206 is a positive-tone resist, hence the exposed regions will be removed during the step of development 200b to form a first set of resist feature (FSRF) 204c, as shown at (b). During the following steps of etch and strip 200c, the PL 208 is etched while the FSRF 204c protects the first selected region (FSR) 204d in the PL 208 and the FSRF 204c is then stripped as shown at (c). A second mask (SM) 214 is used according to a second mask layout, the SM 214 bearing transparent 214a and opaque 214b regions. As shown at (d), a second tone resist (STR) 216 is provided on the FSR 204d and partially on the Sub 210. The STR 216 is given an exposure 200d to a radiation 212 through the transparent regions 214a of SM 214. In this embodiment, the STR 216 is a positive-tone resist, hence the exposed regions will be removed during the step of development 200e, as shown at (e). A second set of resist feature (SSRF) 214c is formed. By a step of etch and strip 200f, a portion of the FSR 204d is selectively removed to form a void 218 therein for rectifying the error. The SSRF 214c is then stripped, as shown at (f). Second selected regions (SSR) 214d are retained on the Sub 210.

Figures 2, 2B:
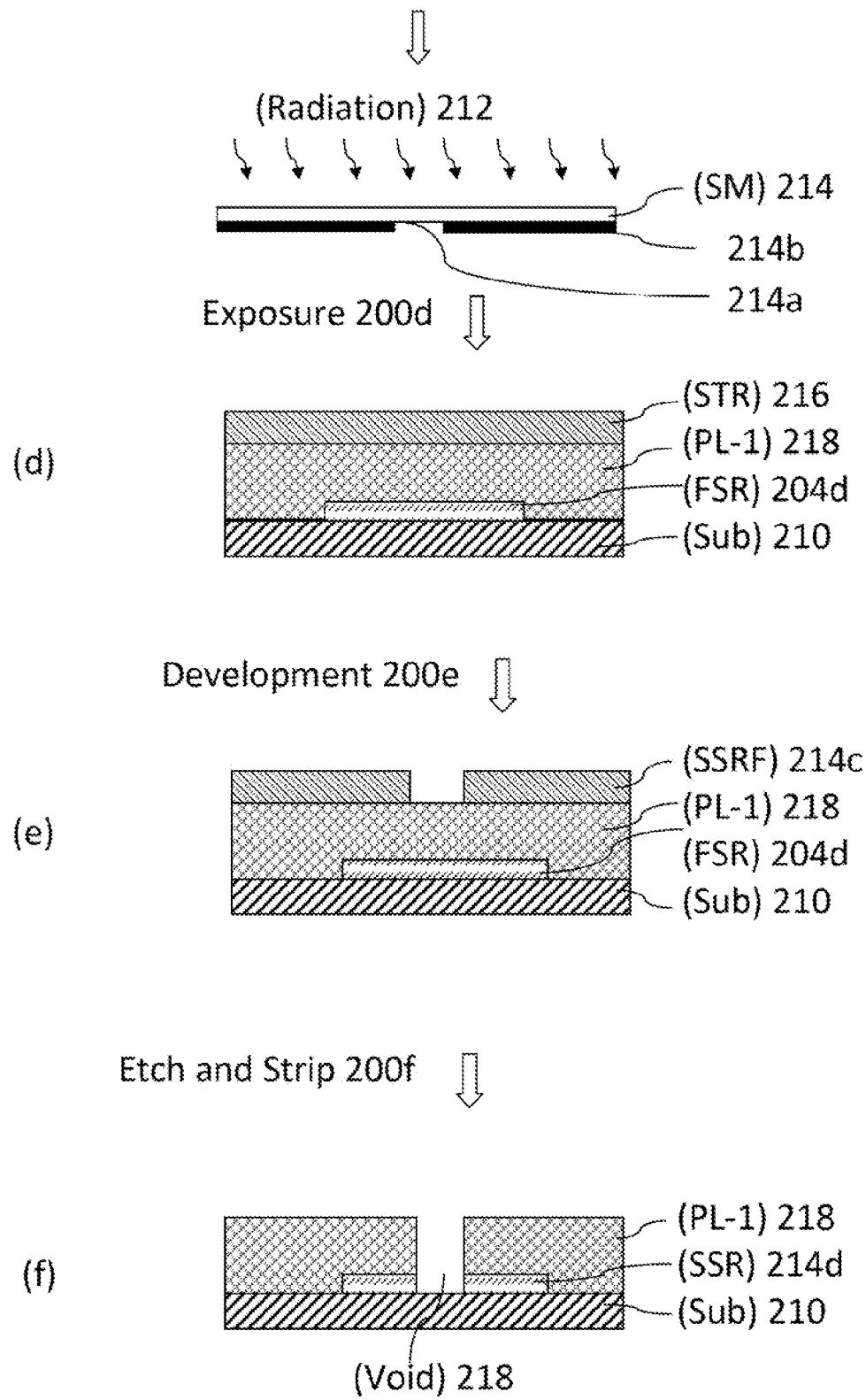

FIG. 2B-2 shows a flowchart of processes of lithography and etch for rectifying an error in a mask layout, in accordance with an embodiment that is an alternative to the process shown at FIG. 2B-1. In FIG. 2B-2, a further processed layer (PL-1) 218 is deposited over Sub 210 and FSR 204d at the step at (d). The steps of exposure 200d and development 200e follow as in the previous embodiment described in FIG. 2B-1, but with the (PL-1) 218 remaining over the Sub 210 and FSR 204d. During the step of etch and strip 200f, the etching is conducted for the PL-1 first and then for the FSR 204d, to form the void 218. The SSRF 214c is then stripped, as shown at (f). The PL-1 218 may be a single layer or a stack of layers.

As described in FIGS. 2A, 2B-1 and 2B-2, the first selected region 204d is formed in any layer during the fabrication process, such as a metallization layer or a polysilicon layer or a dielectric layer or in the Sub 210 itself. According to an embodiment, the method further comprises processing for at least partially filling said void(s) 218 with a dielectric material, for better isolation of the multiple SSR 214d. In the embodiments described here, both of the FTR 206 and the STR 216 are positive-tone photoresists. The choice of the FTR 206 and the STR 216 would be limited by the geometries of the FSRF 204c and SSRF 214c.

In all these embodiments, the Sub 110 or Sub 210 may originate from a semiconductor wafer or a lithium niobate wafer or a silicon on insulator (SOI) wafer or a wafer of any other material.

The embodiments of the invention are compatible with any semiconductor technology such as complementary metal-oxide-semiconductor (CMOS), bipolar-junction-transistor and CMOS (BiCMOS), silicon-on-insulator (SOI) and the like. The scope of the invention is also not limited to any particular technology in terms of processing sequence, materials, physical dimensions and the like.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A method for fabricating a circuit, said method comprising:
    forming a first at least one resist feature on a processed layer, wherein said first at least one resist feature corresponds to a first mask layout, and wherein said first mask layout has an error;
    etching at a first time said processed layer while said first at least one resist feature protects a first at least one selected region of said processed layer;
    stripping said first at least one resist feature;
    forming a second at least one resist feature on said processed layer, wherein said second at least one resist feature corresponds to a second mask layout;
    etching at a second time said processed layer while said second at least one resist feature protects a second at least one selected region of said processed layer, wherein said etching at a second time selectively removes a portion of said first selected region of said processed layer and forms a void therein for rectifying said error; and
    at least partially filling said void with a dielectric material.

2. The method of claim 1, wherein said error causes two lines of said circuit on said processed layer to be connected instead of being disconnected.

3. The method of claim 1, wherein said first at least one selected region is in a metallization layer.

4. The method of claim 1, wherein said processed layer is formed on a subustrate and said substrate originates from one of the following:
    a) a semiconductor wafer,
    b) a lithium niobate wafer, and
    c) a silicon on insulator (SOI) wafer.

5. The method of claim 1, wherein both of said first at least one resist feature and said second at least one resist feature are defined by positive-tone photoresists.

* * * * *